(12) United States Patent
Pai et al.

(10) Patent No.: US 6,586,806 B1
(45) Date of Patent: Jul. 1, 2003

(54) METHOD AND STRUCTURE FOR A SINGLE-SIDED NON-SELF-ALIGNED TRANSISTOR

(75) Inventors: Sheng Yueh Pai, Saratoga, CA (US); Fredrick B. Jenne, Los Gatos, CA (US); Rakesh B. Sethi, Campbell, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 752 days.

(21) Appl. No.: 08/929,308

(22) Filed: Sep. 3, 1997

Related U.S. Application Data
(60) Provisional application No. 60/059,973, filed on Jun. 20, 1997.

(51) Int. Cl.$^7$ .............................................. H01L 29/76
(52) U.S. Cl. ...................................... 257/401; 257/389
(58) Field of Search ................................. 257/401, 389

(56) References Cited

U.S. PATENT DOCUMENTS

| | | | | |
|---|---|---|---|---|
| 4,266,283 A | * | 5/1981 | Perlegos et al. ............. 365/104 |
| 4,851,361 A | | 7/1989 | Schumann et al. ........... 437/30 |
| 5,422,505 A | * | 6/1995 | Shirai .......................... 257/327 |
| 5,553,018 A | * | 9/1996 | Wang et al. ............ 365/185.01 |
| 5,741,737 A | * | 4/1998 | Kachelmeier ................ 438/286 |
| 5,783,470 A | * | 7/1998 | Rostoker .................... 438/253 |
| 5,801,416 A | * | 9/1998 | Choi et al. .................. 257/335 |

* cited by examiner

Primary Examiner—Sara Crane
(74) Attorney, Agent, or Firm—Sonnenschein Nath & Rosenthal

(57) ABSTRACT

A transistor includes a non-self-aligned gate-terminal junction in a substrate having a relatively thick oxide layer disposed between a gate region and a terminal region and a relatively thin oxide layer disposed between the gate structure and the substrate. The terminal region may be the drain region of the transistor and it may include a buried N+ region within the substrate. The transistor may be formed in a p-well. Further, the transistor may also include a self-aligned gate-terminal junction between the gate structure and a source region. In a further embodiment, a transistor fabrication method includes forming an active area in a substrate and implanting an N-type impurity into a first terminal region of the active area. An oxide layer is differentially grown over the active area so that the oxide layer has a first thickness over the first terminal region and a second thickness over the remaining portion of the active area. The first thickness is substantially thicker than the second thickness and, in some embodiments, may be up to twice as thick as the second thickness. A gate structure is formed within the active area, overlapping the oxide layer over the first terminal region. A second terminal region within the active area is then formed adjacent to the gate structure. The first terminal region may be a drain region and the N-type impurity may be Arsenic or Phosphorous or a combination of Arsenic and Phosphorous.

10 Claims, 5 Drawing Sheets

US 6,586,806 B1

METHOD AND STRUCTURE FOR A SINGLE-SIDED NON-SELF-ALIGNED TRANSISTOR

RELATED APPLICATION

This application claims the benefit of Provisional Application Ser. No. 60/059,973, filed Jun. 20, 1997.

FIELD OF THE INVENTION

The present invention relates to fabrication of transistor devices and, in particular, to such devices which have high breakdown voltages.

BACKGROUND

Programmable devices, e.g., memory devices, programmable devices, etc., are commonly fabricated using CMOS processing techniques. Often, these techniques include the formation of drain and source regions of a storage element (i.e., a transistor) using a previously created polysilicon gate structure as a mask. When a gate structure is used in this fashion, the resulting drain and source regions of the transistor are said to be self-aligned. That is, the boundaries of the source and drain regions will be aligned to the edge of the polysilicon gate structure which was used as a mask.

In addition to storage elements, i.e., memory cells, however, a programmable device often includes other circuitry such as address decoding circuitry and/or programming circuitry (e.g., in the case of EEPROMs, CPLDs, FPGAs and the like). Some of these peripheral circuits, e.g., those controlling the programming and/or erasing of the storage elements, require transistors capable of withstanding high voltages far in excess of the signal voltages which are otherwise used in the programmable device. For example, a CMOS memory device such as an EEPROM may typically use voltages of 3.3 volts or 5 volts for internal or external signals but may use voltages of 18–20 volts for programming and/or erasing operations. Transistors in the programmable device may be required to block these high voltages at some times and pass them at others. In essence then, these transistors operate as high voltage switches. During such operations the transistors must provide low leakage currents so as not to present increased power consumption for the programmable device as a whole and further to avoid latch up.

For NMOS transistors, a voltage at the drain is blocked when the gate is grounded. In such a scenario, the transistor is off, thus no voltage is passed. However, under these conditions, the gate-drain junction of the transistor is susceptible to breakdown due to several factors. For example, the gate oxide thickness, the junction impurity concentration and the junction depth may all contribute towards the susceptibility of the device to breakdown. Further, if the transistor is formed with self-aligned junctions (as may be the case where such transistors are formed as part of the same processing steps used to create storage elements in a memory device), the risk of breakdown at high voltages is increased. Moreover, the channel width under the gate of the transistor must be of sufficient width to avoid punchthrough. This generally means that high voltage transistors fabricated using self-aligned junction techniques must be relatively large (e.g., on the order of 1.6 μm), consuming valuable die area.

SUMMARY OF THE INVENTION

In one embodiment, the present invention provides a single-sided, non-self-aligned transistor which includes a non-self-aligned gate-terminal junction in a substrate and having a relatively thick oxide layer disposed between a gate structure and a terminal region and a relatively thin oxide layer disposed between the gate structure and the substrate. The terminal region may be the drain region of the transistor and it may include a buried N+ region within the substrate. The transistor may be formed in a p-well in the substrate. Further, the transistor may also include a self-aligned gate-terminal junction between the gate structure and a source region.

In a further embodiment, the present invention provides a transistor fabrication method which includes forming an active area in a substrate and implanting an N-type impurity into a first terminal region of the active area. An oxide layer is differentially grown over the active area so that the oxide layer has a first thickness over the first terminal region and a second thickness over the remaining portion of the active area. The first thickness is substantially thicker than the second thickness and, in some embodiments, may be up to twice as thick as the second thickness. A gate structure is formed within the active area, overlapping the oxide layer over the first terminal region. A second terminal region within the active area is then formed adjacent to the gate structure. The first terminal region may be a drain region and the N-type impurity may be Arsenic or Phosphorous or a combination of Arsenic and Phosphorous.

In yet another embodiment of the present invention a memory device may include a non-volatile storage element and a high-voltage transistor. The high-voltage transistor may include a non-self-aligned gate-terminal junction having a breakdown voltage of at least 18 Volts. The gate-terminal junction may be a gate-drain junction and may include a thick oxide layer disposed between a gate structure and a drain region.

The present invention provides a transistor having a reduced size (i.e., pitch) as compared to transistors of the past having a similar breakdown voltage.

BRIEF DESCRIPTION OF THE DRAWINGS

The present invention is illustrated by way of example, and not limitation, in the figures of the accompanying drawings, in which.

DETAILED DESCRIPTION

Described herein is a single-sided, non-self-aligned transistor which includes a non-self-aligned gate-terminal junction in a substrate and having a relatively thick oxide layer disposed between a gate structure and a terminal region and a relatively thin oxide layer disposed between the gate structure and the substrate. The terminal region may be the drain region of the transistor and it may include a buried N+ region within the substrate. The transistor may be formed in a p-well in the substrate. Further, the transistor may also include a self-aligned gate-terminal junction between the gate structure and a source region.

In a further embodiment, the present invention provides a transistor fabrication method which includes forming an active area in a substrate and implanting an N-type impurity into a first terminal region of the active area. An oxide layer is differentially grown over the active area so that the oxide layer has a first thickness over the first terminal region and a second thickness over the remaining portion of the active area. The first thickness is substantially thicker than the second thickness and, in some embodiments, may be up to twice as thick as the second thickness. A gate structure is formed within the active area, overlapping the oxide layer over the first terminal region. A second terminal region within the active area is then formed adjacent to the gate structure. The first terminal region may be a drain region and the N-type impurity may be Arsenic or Phosphorous or a combination of Arsenic and Phosphorous.

In yet another embodiment of the present invention a memory device may include a non-volatile storage element and a high-voltage transistor. The high-voltage transistor may include a non-self-aligned gate-terminal junction having a breakdown voltage of at least 18 volts. The gate-terminal junction may be a gate-drain junction and may include a thick oxide layer disposed between a gate structure and a drain region.

The present invention provides a transistor having a reduced size (i.e., pitch) as compared to transistors of the past having a similar breakdown voltage. It should be recognized, however, that this and the above-described embodiments are illustrative only and that, upon review of this Specification, others skilled in the art may recognize that other embodiments are within the spirit and scope of the present invention. For example, although described as being fabricated in a p-well, a single-sided non-self-aligned transistor according to the present invention may alternatively be fabricated in an n-well (e.g., a high-voltage PMOS device). Further, although in one embodiment the single-sided non-self aligned transistor is fabricated outside of a memory core (e.g., as part of a peripheral circuit), such a transistor could be fabricated inside a memory core or as part of a logic cell of a programmable device.

Figure 1:
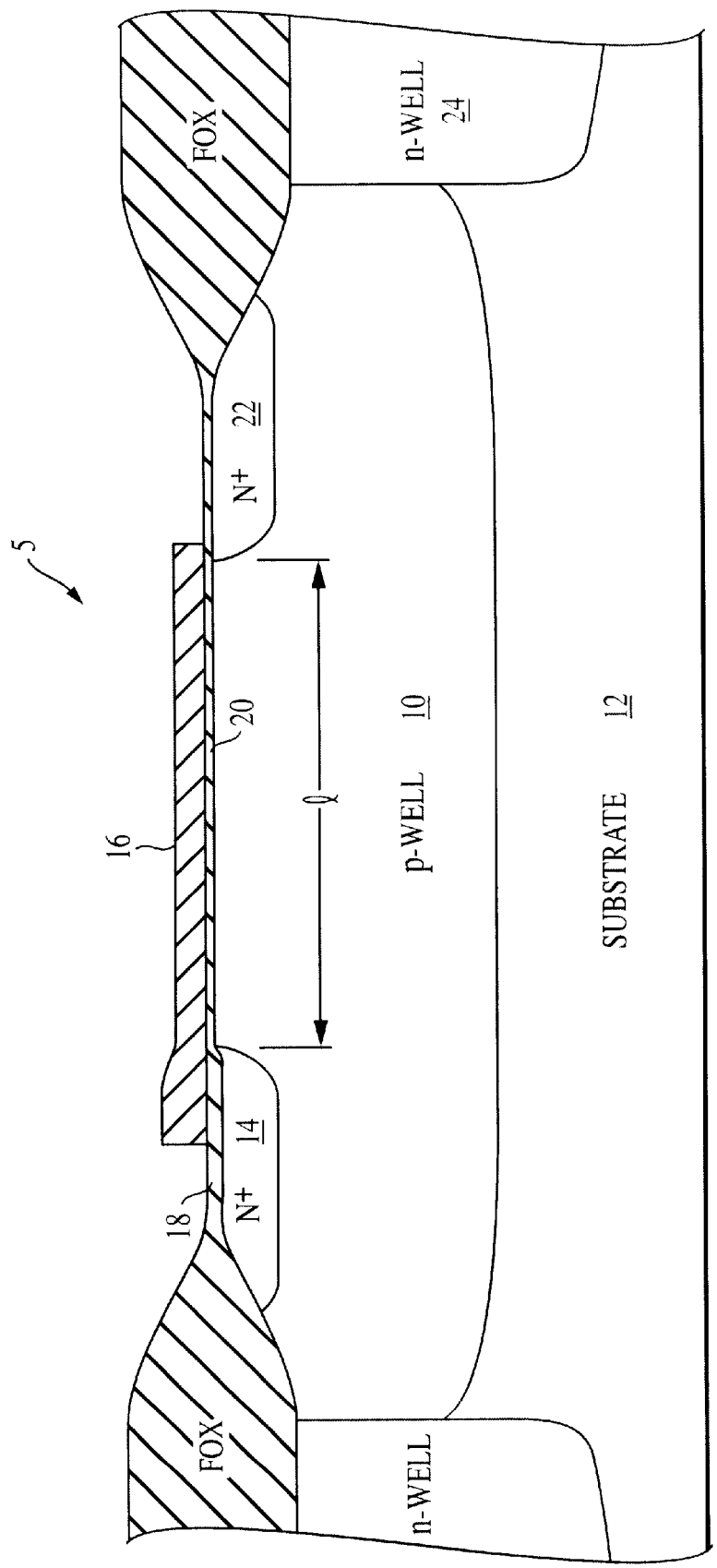
FIG. 1 illustrates a cross-sectional view of single-sided non-self-aligned transistor according to one embodiment of the present invention.

As shown in FIG. 1, a single-sided non-self aligned transistor 5 fabricated in accordance with one embodiment of the present invention is made in a p-well 10 of a semiconductor substrate 12. The p-well 10 is fabricated in the substrate 12 according to conventional semiconductor processing techniques. Alternatively, the single-sided non-self-aligned transistor may be fabricated in a P-type monocrystalline silicon substrate that has been doped to a desired resistivity level (e.g., 5–50 ohms-cm).

The single-sided non-self-aligned transistor 5 includes a terminal region 14 and a polysilicon gate structure 16. Disposed between the terminal region 14 and the gate structure 16 (i.e., in the gate-terminal junction) is a relatively thick oxide layer 18. A relatively thin oxide layer 20 is disposed between the gate structure 16 and the p-well 10. As further discussed below, oxide layer 18 and oxide layer 20 are preferably grown as a single oxide in a single growth step. Because the terminal region 14 is implanted (e.g., with N-type impurities) prior to the growth step, it will oxidize faster than other, non-implanted areas of p-well 10 and, thus, at the conclusion of the growth step the oxide layer will be thicker over terminal region 14 than over other areas of p-well 10. Another terminal region 22 is disposed on the opposite side of the gate structure 16 from the terminal region 14. As will become apparent below, the junction between terminal region 14 and gate structure 16 is a non-self-aligned junction while the junction between gate structure 16 and terminal region 22 is a self-aligned junction.

Terminal regions 14 and 22 may be buried N+ implant regions where transistor 5 is an NMOS device. In one embodiment, terminal region 14 is a drain region, approximately 0.4 $\mu$m deep while terminal region 22 is a source region, approximately 0.2 $\mu$m deep. Oxide layer 18 is approximately 180–225 Å thick while oxide layer 20 is approximately 70–200 Å, preferably approximately 150 Å, thick. The p-well 10 may be approximately 1 $\mu$m thick while an adjoining n-well 24 may be approximately 2.5 $\mu$m thick. The channel length "1" may be approximately 1.2 $\mu$m. The manner in which the above-described layers and regions are formed will now be discussed.

Figure 2:
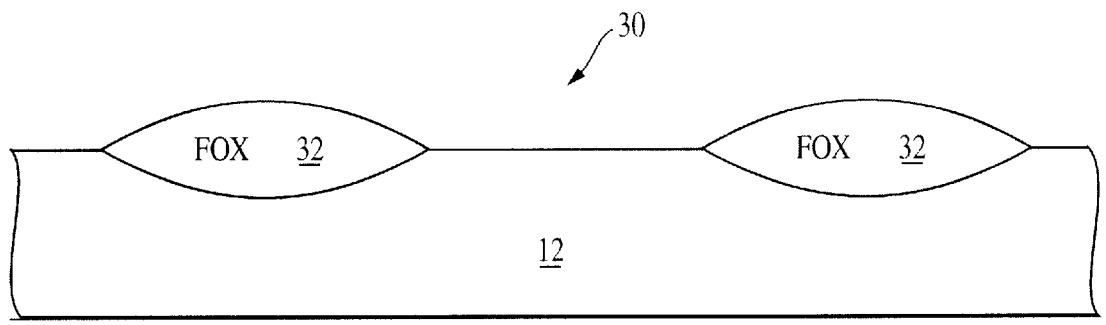
FIGS. 2–9 are cross-sectional views showing various processing steps according to one embodiment of the present invention for forming a single-sided non-self-aligned transistor.

Referring now to FIG. 2, active areas 30 in the substrate 12 are defined by the creation of field oxide (FOX) isolation structures 32 (note, p-well 10 is not illustrated so as not to obscure the drawing). These isolation structures 32 may be formed using conventional techniques, for example local oxidation of silicon (LOCOS). In general, a thin silicon dioxide layer is grown over the substrate 12 and a silicon nitride film is then deposited, e.g., using conventional chemical vapor deposition (CVD) techniques. The silicon nitride layer is then etched (e.g., after a masking process) to define the active areas 30. The etching may be performed using conventional plasma chemistry techniques. The silicon dioxide layer acts as a stress relief layer to prevent defects from forming in the substrate 12 as a result of stresses produced by the silicon nitride film.

After the active areas 30 are defined, a channel stop may be formed by implanting boron ions into the substrate in the conventional fashion. The boron implantation may be followed by a field oxidation cycle to grow a thick oxide layer in the isolation areas, using the patterned nitride layer as an oxidation mask.

A thin silicon dioxide layer may be formed on the top of silicon nitride layer during the field oxidation process. This top oxide layer is removed and the silicon nitride layer is then stripped, again using conventional etch chemistries. Finally, the thin oxide layer that was under the nitride layer is removed and the wafer cleaned. This leaves the active areas 30 ready for implantation.

Figure 3:
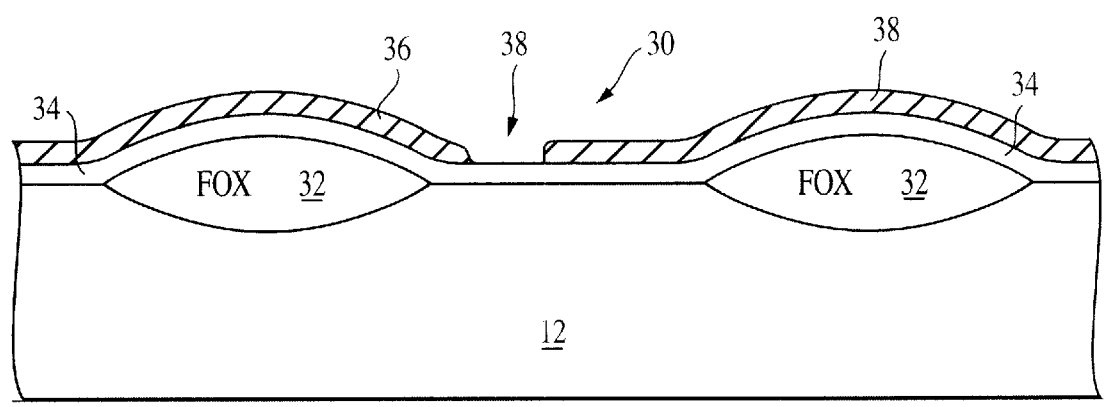
Figure 4:
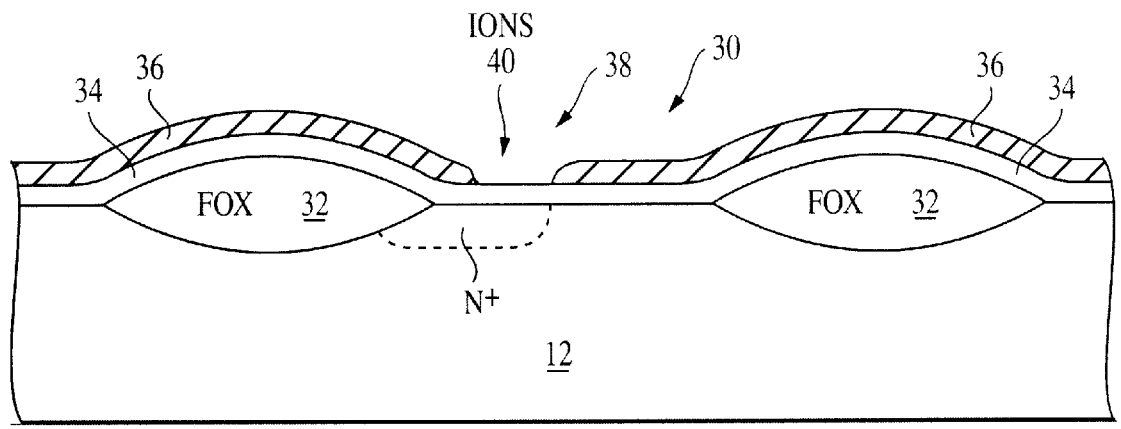

Prior to implantation, and as shown in FIG. 3, a sacrificial oxide layer 34 approximately 300 Å thick may be grown. A photoresist mask 36 may then be used to define a terminal region 38 (e.g., a drain region) and, as shown in FIG. 4, a buried N+ implant for the terminal region 38 may then be performed.

Figure 5:
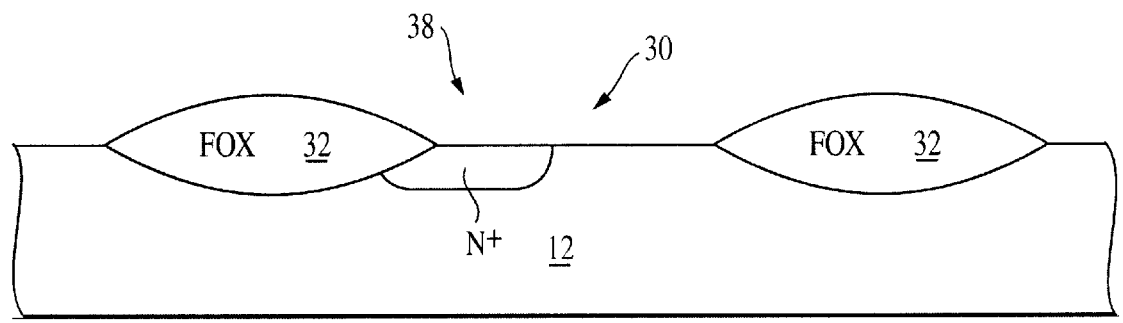

Arsenic (As) and/or phosphorous (P) ions 40 may be used for the implant. The implant dose is approximately $1 \times 10^{14}$ cm$^{-2}$ at 70 KeV for arsenic and approximately $5 \times 10^{13}$ cm$^{-2}$ for phosphorous. Note that in a preferred embodiment, only one terminal region 38 (e.g., a drain) for the single-sided non-self-aligned transistor 5 is formed at this time. However, in other embodiments, both terminal regions (i.e., source and drain) may be formed at this time. Because the terminal region 38 is formed prior to the creation of a gate structure, terminal region 38 will be a non-self-aligned terminal region (i.e., its boundaries are not defined by a mask comprising the gate structure). The photoresist layer 36 is then stripped off and the semiconductor die is annealed at approximately 900° C. for approximately 30 minutes. The sacrificial oxide layer 34 may then be removed to leave the structure shown in FIG. 5.

Figure 6:
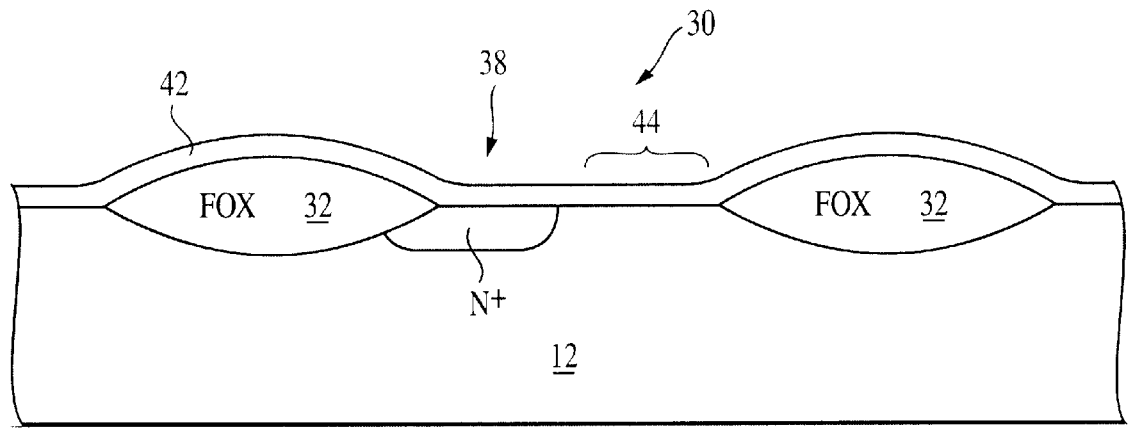
Figure 7:
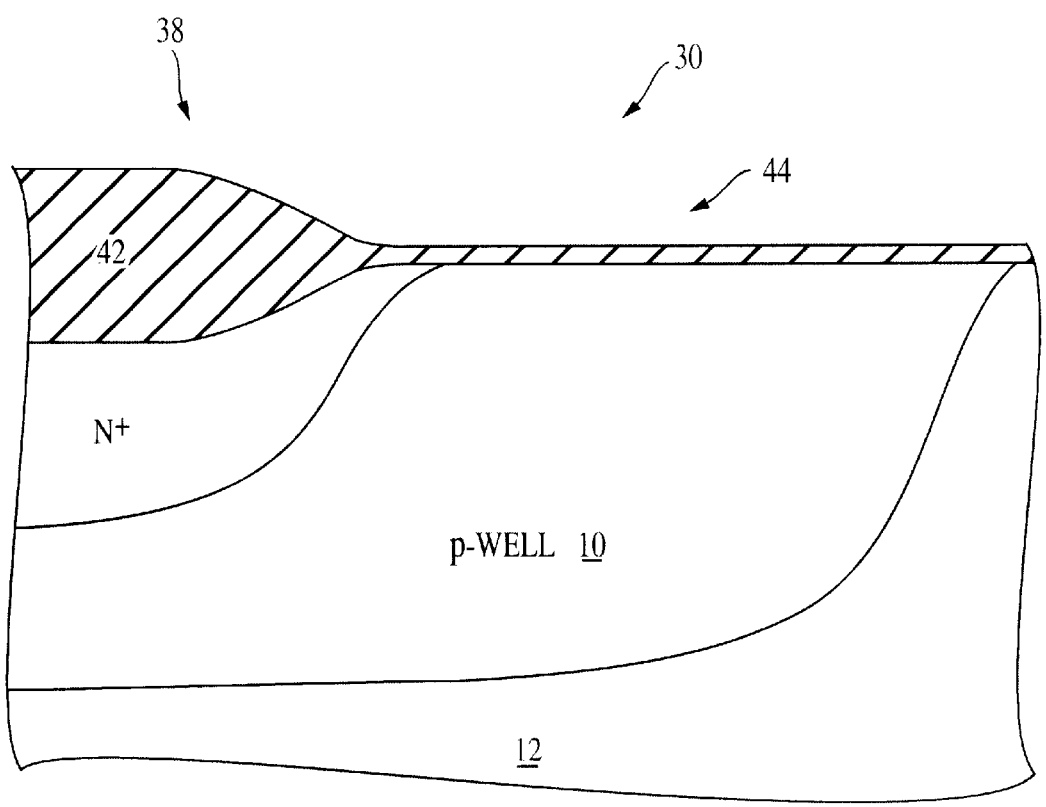

Now referring to FIG. 6, following the formation of the non-self-aligned terminal region 38, a gate oxide layer 42 is grown by exposing the substrate 12 to a dry/wet atmosphere at approximately 800° C. Because of the implant in the terminal region 38, the thickness of this oxide layer 42 will be greater in the area over the terminal region 38 than in a remaining region of the active area 30. That is, the gate oxide layer 38 grows at different rates in the different regions of the active area 30 but the different thicknesses are grown simultaneously. Depending on the implant dose, the gate oxide 38 will grow approximately 1.1 times or more, and preferably 1.1 to 2 times, faster over the doped terminal region 38 than over the remaining region 44 of the active area 30. So, for a gate oxide thickness of approximately 150 Å in the non-terminal region 44, a gate oxide thickness of approximately 225–300 Å will result in the terminal region 38. FIG. 7 is a close-up view of active area 30 which shows the differential oxide growth thickness.

Figure 8:
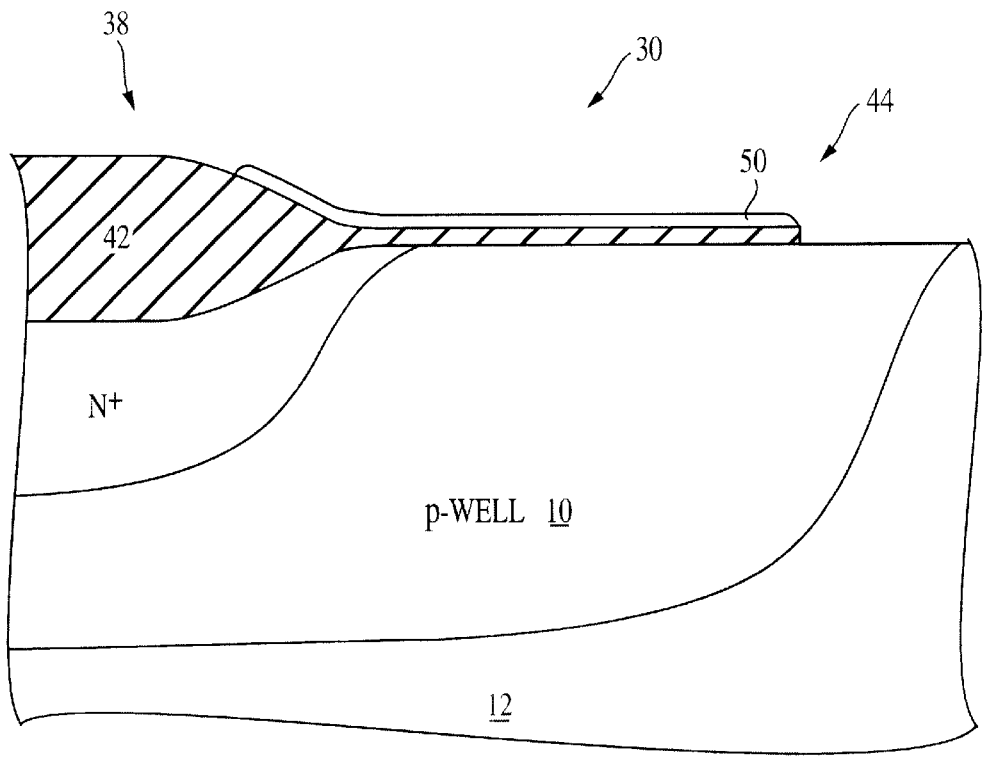

As shown in FIG. 8, once the gate oxide layer 42 has been grown, a low pressure chemical vapor deposition (LPCVD) process may be used to form a polycrystalline silicon (polysilicon) gate structure 50. This gate structure 50 may be formed after masking an appropriate region of the active area 30 adjacent to and overlapping the previously formed non-self-aligned terminal region 38 using conventional photolithographic techniques. The gate structure 50 is formed to conventional thicknesses (e.g., 1000–2000 Å). The remaining oxide 42 may then be stripped.

Figure 9:
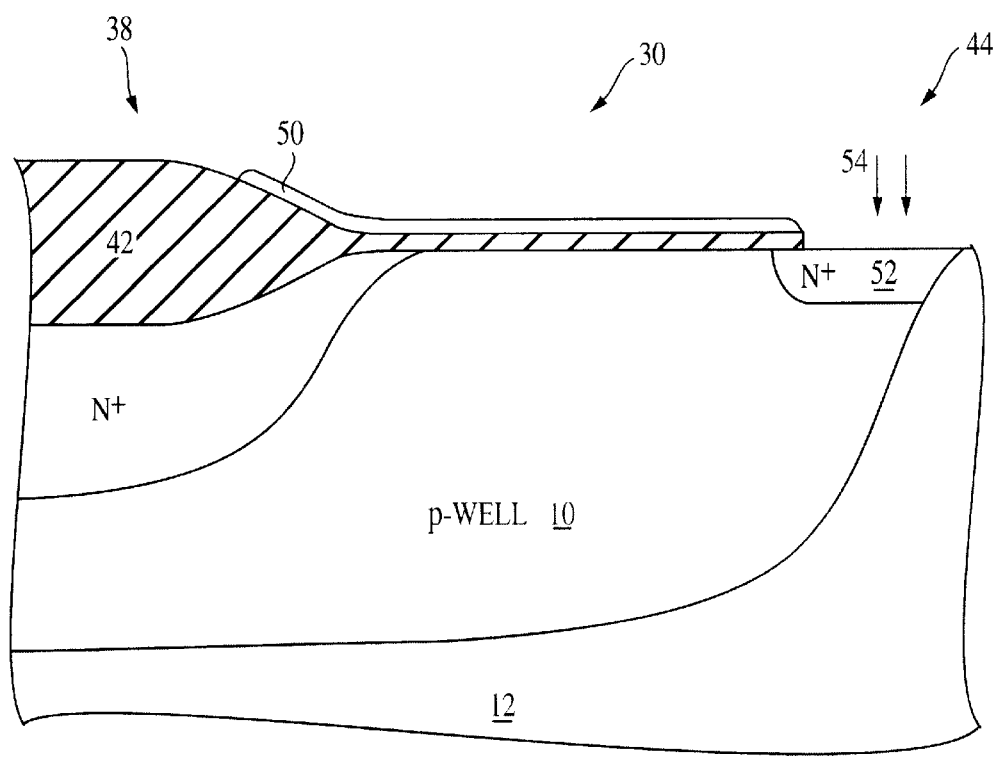

Following the formation of the polysilicon gate structure 50, it may be used as a mask to form a self-aligned terminal region 52 (e.g., a source region) on the opposite side of the gate structure 50 from the non-self-aligned terminal region 38. This self-aligned terminal region 52 may be formed using conventional CMOS processing techniques, e.g., doping the region with an N-type impurity 54 such as arsenic and/or phosphorous as shown in FIG. 9. Once the self-aligned terminal region 52 has been formed, leaving the structure shown in FIG. 1, the single-sided non-self-aligned transistor 5 may be further fabricated in accordance with conventional CMOS processing techniques. This may include forming a protective oxide layer (not shown) over the structure and forming metal contacts (not shown) to the terminal (source and drain) regions 14 and 22 and the polysilicon gate 16 to provide electrical connections.

The single-sided non-self-aligned transistor 5 has a "softer" gate-terminal (e.g., gate-drain) junction than would otherwise be formed had the junction been created as a self-aligned junction. That is, the gate-terminal junction is sloped, rather than having a sharp boundary. This results in a junction which is better capable of withstanding high gate-junction voltages without breaking down. Indeed, transistors produced according to the methods of the present invention are capable of withstanding voltages in excess of 18 Volts across the gate-terminal junction without breaking down. The increased voltage breakdown tolerance is achieved, in part, because of the relatively thick oxide layer 18 disposed between the gate structure 16 and the non-self-aligned terminal region 14. This relatively thick oxide layer 16 results from the differential oxide growth rate achieved due to the doping of the non-self-aligned terminal region 14 before the formation of the gate structure 16. The thick oxide layer 18 reduces field strengths across the gate-terminal junction during grounded gate conditions. Notably, the thick oxide layer 18 is achieved without the need for an extra masking step, thereby allowing the use of conventional oxide growth processes without increasing fabrication costs.

The present invention also allows for reduced channel sizes of transistors. That is, using the methods of the present invention, a transistor having a given breakdown voltage tolerance will be smaller than a transistor formed according to the methods of the past (e.g., with self-aligned junctions) having a similar breakdown voltage. For example, the present invention allows formation of transistors having a breakdown voltage of at least 18 Volts and a channel length of 1–1.2 $\mu$m inside a p-well (or 0.8–1.0 $\mu$m outside a p-well), while transistors having a similar breakdown voltage formed using self-aligned junctions typically require channel lengths of at least 1.6 $\mu$m. Thus, the present invention allows the creation of high voltage transistors having reduced die size (for a given breakdown voltage) as compared to transistors of the past. Such transistors may find application as input protection ESD (electrostatic discharge) devices due to their superior snapback characteristics.

In addition to the above, transistors formed according to the present invention may have very low leakage currents, e.g., on the order of 1–10 pAmps. This allows for shrinking the size of current pumps in a memory device employing such transistors because only low current charge pumps will be needed. Such transistors may find application as a component in a peripheral circuit of a memory device which also includes one or more storage elements (e.g., a high voltage transistor in an EEPROM or the like).

Thus, a single-sided non-self-aligned transistor has been described. Although discussed with reference to certain specific illustrated embodiments, it should be recognized that the present invention is applicable to a variety of processing applications. For example, although described as being fabricated in a p-well, a single-sided non-self-aligned transistor according to the present invention may alternatively be fabricated outside of a p-well in a P-type substrate. Such an application may be particularly suitable where a low body effect is desired as transistors formed inside a p-well may have a higher threshold voltage, thus requiring a larger voltage pump. Accordingly, the above-described embodiments should be regarded as illustrative only and the present invention measured only in terms of the claims which follow.

What is claimed is:

1. A transistor, comprising:
    a non-self-aligned gate-terminal junction in a substrate, said non-self-aligned gate-terminal junction having a first oxide layer of a first thickness disposed between a gate structure and a first terminal region; and
    a self-aligned gate-terminal junction in said substrate, said self-aligned gate-terminal junction having a second oxide layer of a second thickness less than said first thickness disposed between said gate structure and a second terminal region.

2. A single-sided non-self-aligned transistor as in claim 1 wherein said first terminal region comprises a drain region.

3. A single-sided non-self-aligned transistor as in claim 2 wherein said drain region comprises a buried N+ region within said substrate.

4. A single-sided non-self-aligned transistor as in claim 3 wherein said transistor is formed in a p-well of said substrate.

5. A memory, comprising:
    storage element; and
    the transistor of claim 1.

6. A memory as in claim 5 wherein said transistor has a grounded gate breakdown voltage of at least 18 Volts.

7. A memory as in claim 5 wherein said first terminal region of said transistor comprises a drain region.

8. A memory as in claim 5 wherein said first oxide layer and said second oxide layer are formed simultaneously.

9. A memory as in claim 8 wherein said first oxide layer is approximately 1.1–2 times thicker than said second oxide layer.

10. A memory as in claim 9 wherein said second oxide layer is approximately 150 Å thick.

* * * * *